United States Patent
Im et al.

(10) Patent No.: US 7,573,763 B2
(45) Date of Patent: Aug. 11, 2009

(54) REDUNDANCY CIRCUIT

(75) Inventors: Jae Hyuk Im, Ichon (KR); Yong Ju Chon, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/958,320

(22) Filed: Dec. 17, 2007

(65) Prior Publication Data
US 2008/0304341 A1 Dec. 11, 2008

(30) Foreign Application Priority Data
Jun. 11, 2007 (KR) .................. 10-2007-0056937

(51) Int. Cl.
*G11C 7/00* (2006.01)
(52) U.S. Cl. ..................... 365/200; 365/201
(58) Field of Classification Search .............. 365/200, 365/201
See application file for complete search history.

(56) References Cited

U.S. PATENT DOCUMENTS

| 5,732,029 | A | | 3/1998 | Lee et al. |
| 5,946,257 | A | * | 8/1999 | Keeth .................. 365/226 |
| 6,078,540 | A | * | 6/2000 | Keeth .................. 365/226 |
| 6,704,228 | B2 | * | 3/2004 | Jang et al. ............. 365/200 |
| 6,958,945 | B2 | * | 10/2005 | Shore .................. 365/222 |
| 6,967,878 | B2 | | 11/2005 | Dono |
| 7,184,335 | B2 | | 2/2007 | Boldt et al. |
| 7,308,598 | B2 | * | 12/2007 | Beattie et al. ............ 714/5 |
| 2002/0176303 | A1 | * | 11/2002 | Shore .................. 365/222 |
| 2005/0041491 | A1 | | 2/2005 | Kyung |
| 2006/0039178 | A1 | * | 2/2006 | Shore .................. 365/149 |
| 2007/0086252 | A1 | | 4/2007 | Lim et al. |

FOREIGN PATENT DOCUMENTS

| JP | 2000-076889 | 3/2000 |
| JP | 2001-023391 | 1/2001 |
| JP | 2001-056361 | 2/2001 |
| KR | 1020030083920 | 11/2003 |
| KR | 1020070038672 | 4/2007 |

* cited by examiner

*Primary Examiner*—Michael T Tran
(74) *Attorney, Agent, or Firm*—Baker & McKenzie LLP

(57) ABSTRACT

A redundancy circuit can include a first fuse set that is configured to receive an address signal and an initializing signal activated when power is up, and to output a first redundancy signal, the first redundancy signal being used to repair a defective cell by using a laser beam radiating method, a second fuse set that is configured to receive the initializing signal, a specific address signal, a test mode signal that is activated when a defective cell exists, and the address signal, and to output a second redundancy signal, the second redundancy signal being used to repair the defective cell by using an electrical fusing method, a first memory cell array that is controlled by the first redundancy signal, and a second memory cell array that is controlled by the second redundancy signal.

25 Claims, 7 Drawing Sheets

REDUNDANCY CIRCUIT

CROSS-REFERENCES TO RELATED APPLICATION

This application claims priority under 35 U.S.C. 119(a) to Korean Patent Application number 10-2007-0056937, filed on Jun. 11, 2007, in the Korean Intellectual Property Office, the contents of which are incorporated herein by reference in their entirety as if set forth in full.

BACKGROUND

1. Technical Field

The disclosure herein relates to a redundancy circuit, and more particularly, to a redundancy circuit capable of repairing a defective cell.

2. Related Art

In general, when at least one defective memory cell exists in a semiconductor memory apparatus, the memory apparatus is regarded as a defective product that cannot be sold. Therefore, a redundancy technique for providing reserved memory cells in the semiconductor memory apparatus has been used. Conventional redundancy techniques include a method of providing laser fuse sets and using a laser beam to cut a fuse and thereby replace a bad memory cell with a replacement cell.

When a wafer manufacturing process is completed, a test process is performed to detect a defective memory cell, and a laser beam is irradiated to cut the fuse. Then, programming is performed. Positional information of the defective memory cell, that is, the address of the defective memory cell having the fuse cut, is stored, and the information is stored in a redundancy memory cell to replace the defective memory cell.

A defective memory cell may occur later in the packaging process. For example, a defective memory cell can occur due to an additional defect in the packaging process, or it can occur when the defective cell is not repaired by irradiation with a laser beam. However, the redundancy circuit controlled by the method of irradiating a laser beam cannot repair defective cells occurring in the packaging process.

SUMMARY

A redundancy circuit that allows repairing defective cells is described herein.

According to aspect, a redundancy circuit can include a first fuse set that can be configured to receive an address signal and an initializing signal activated when power is up, and to output a first redundancy signal, the first redundancy signal being used to repair a defective cell by using a laser beam radiating method, a second fuse set that is configured to receive the initializing signal, a specific address signal, a test mode signal that is activated when a defective cell exists, and the address signal, and to output a second redundancy signal, the second redundancy signal being used to repair the defective cell by using an electrical fusing method, a first memory cell array that is controlled by the first redundancy signal, and a second memory cell array that is controlled by the second redundancy signal.

According to another aspect, the second fuse set can include third and fourth fuses. The third fuse may be cut by a transient current when a defective memory cell exists, and the fourth fuse may be cut by a transient current in response to a high-level signal among the addresses of defective memory cells.

According to still another aspect, a redundancy circuit can include a first fuse set circuit that can include a plurality of first fuse sets, which can receive an address signal and an initializing signal activated when power is up and then output a plurality of first redundancy signals, a second fuse set circuit that can include a plurality of second fuse sets which can receive the initializing signal, a specific address signal, a test mode signal that is activated when a defective cell exists, and the address signal and to output a plurality of second redundancy signals, a first memory cell array that is controlled by the first redundancy signals, and a second memory cell array that is controlled by the second redundancy signals.

In the redundancy circuit, the first fuse set is configured to output the first redundancy signal for driving a redundancy word line of the first memory cell array in response to a defective memory cell occurring in a wafer state, and the second fuse set can be configured to output the second redundancy signal for driving a redundancy word line of the second memory cell array in response to a defective memory cell occurring in the wafer state and a package state. In this embodiment, the second fuse set may include third and fourth fuses. The third fuse may be cut by a transient current when a defective memory cell exists, and the fourth fuse may be cut by a transient current in response to a high-level signal among the addresses of defective memory cells.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
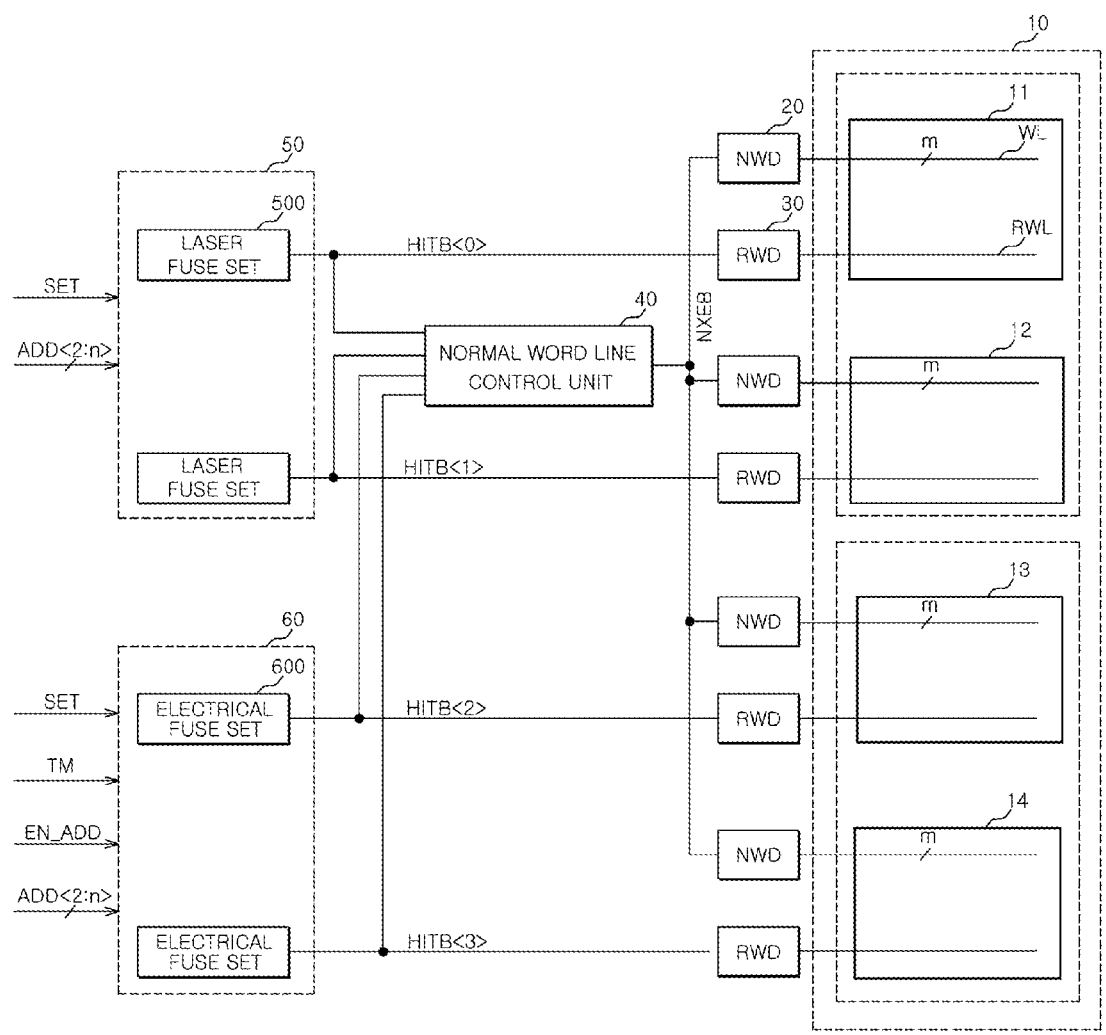
FIG. 1 is a block diagram schematically illustrating the structure of a redundancy circuit according to one embodiment.

FIG. 1 is a block diagram schematically illustrating the structure of a redundancy circuit according to one embodiment. As shown in FIG. 1, a redundancy circuit can include a memory unit 10, a normal word line driver 20, a redundancy word line driver 30, a normal word line control unit 40, a laser fuse set circuit 50, and an electrical fuse set circuit 60.

The memory unit 10 can include a plurality of memory cell arrays 11 to 14. Each of the memory cell arrays 11 to 14 can includes m (where m is an integer number) word lines WL. In addition, each of the memory cell arrays 11 to 14 can include a redundancy word line RWL. Specifically, each of the memory cell arrays 11 to 14 can be an array having a predetermined block size that includes unit cells, and can include the word lines WL for driving normal cells and the redundancy word line RWL for driving a reserved memory cell. That is, each of the memory cell arrays 11 to 14 can drive a spare word line that can be configured to replace a defective memory cell, that is, the redundancy word line RWL. In one embodiment described herein, the redundancy word line RWL can be configured to use a row address in the X direction.

The memory cell arrays 11 to 14 can include redundancy bit lines using column addresses in the Y direction. In addition, a plurality of redundancy word lines RWL can be provided in each of the memory cell arrays 11 to 14 according to the requirements of a specific implementation.

The normal word line drivers 20 and the redundancy word line drivers 30 can be connected to the corresponding memory cell arrays 11 to 14. The normal word line driver 20 can be configured to drive the normal word lines WL, and the redundancy word line driver 30 can be configured to drive the redundancy word line RWL.

The normal word line control unit 40 can be configured to selectively drive the normal word line drivers 20 and the redundancy word line drivers 30. Specifically, when a normal word line control signal (NXEB), provided from the normal word line control unit 40 is activated, the corresponding normal word line WL can be activated. However, when the normal word line control signal (NXEB), provided from the normal word line control unit 40 is deactivated, the corresponding redundancy word line RWL can be activated.

More specifically, the normal word line control unit 40 can be configured to receive a plurality of redundancy signals (HITB<0:3>) from the laser fuse set circuit 50 and the electrical fuse set circuit 60, and output the normal word line control signal (NXEB). That is, when receiving at least one inactive redundancy signal (HITB<0:3>), the normal word line control unit 40 can be configured to output an inactive, normal word line control signal (NXEB) to deactivate the corresponding normal word line WL and to activate the redundancy word line RWL to replace the defective cell.

The laser fuse set circuit 50 and the electrical fuse set circuit 60 can be configured to provide the redundancy signals (HITB<0:3>). The laser fuse set circuit 50 can include a plurality of laser fuse sets 500. The electrical fuse set circuit 60 can include a plurality of electrical fuse sets 600. For the convenience of explanation, one embodiment described herein can include the laser fuse set circuit 50, which can include two laser fuse sets 500, and the electrical fuse set circuit 60, which can include two electrical fuse sets 600.

The laser fuse set circuit 50 can be configured to receive an initializing signal (SET) and address signals (ADD<2:n>), and output the redundancy signals (HITB<0:1>). Then the laser fuse set circuit 50 can be configured to output a first redundancy signal (HITB<0:1>) to the normal word line control unit 40 and the first and second memory cell arrays 11 and 12. The activated redundancy signals (HITB<0:1>) can be configured to serve as information capable of driving the redundancy word line RWL since the received address signals (ADD<2:n>) are positional information of defective memory cells.

In one embodiment, the laser fuse set circuit 50 is not connected to all of the memory cell arrays 11 to 14, but is connected to some memory cell arrays 11 to 12. Therefore, when a defective memory cell occurs, the redundancy word lines RWL of the first and second memory cell arrays 11 and 12 can be used to repair the defective memory cell by using a laser beam to cut the fuse. Thus, the laser fuse set circuit 50 makes it possible to repair a defective memory cell with a laser beam.

The electrical fuse set circuit 60 can be connected to the third and fourth memory cell arrays 13 and 14, which are not connected to the laser fuse set circuit 50. The electrical fuse set circuit 60 can be configured to receive the initializing signal (SET), a test mode signal (TM), a specific address signal (EN_ADD), and the address signals (ADD<2:n>), and output the second redundancy signal (HITB<2:3>).

In one embodiment, the electrical fuse set circuit 60 can be configured to output the second redundancy signals (HITB<3:4>) to the normal word line control unit 40 and the third and fourth memory cell arrays 13 and 14. The activated redundancy signals (HITB<2:3>) can be configured to provide information capable of driving the redundancy word line RWL since the received address signals (ADD<2:n>) are positional information of defective memory cells.

Therefore, the activated redundancy signals (HITB<2:3>) output from the electrical fuse set circuit 60 can be configured to serve as information capable of driving the redundancy word lines RWL connected to the third and fourth memory cell arrays 13 and 14. The electrical fuse set circuit 60 can be configured to make a transient current flow to cut or blow a fuse. Since this embodiment includes the electrical fuse set circuit 60, it is possible to provide signals capable of driving the redundancy word lines RWL to replace the defective memory cells in a package state as well as in a wafer state.

It will be understood that any fuse set can be used as long as it can be repaired in the package state. For example, an anti fuse set can be used as the fuse set. In addition, certain embodiments can use the addresses of comparison targets for redundancy numbered 2 to n. However, this is simply one embodiment, and the address numbers can be changed according to the structure of a redundancy circuit.

Figure 2:
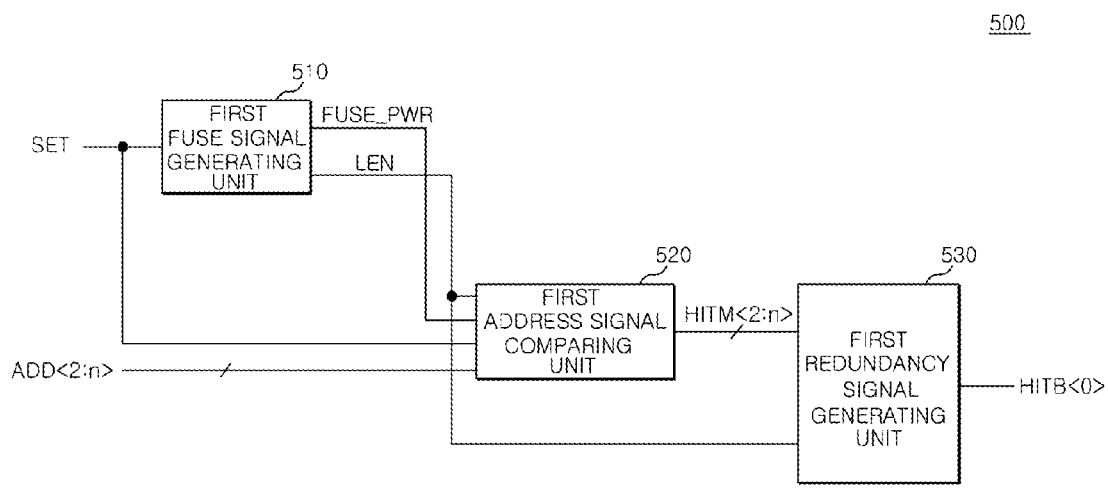
FIG. 2 is a block diagram illustrating a laser fuse set that can be included in the circuit illustrated in FIG. 1.

FIG. 2 is a block diagram illustrating a laser fuse set 500 that can be included in the circuit illustrated in FIG. 1. Referring to FIG. 2, the laser fuse set 500 can include a first fuse signal generating unit 510, a first address signal comparing unit 520, and a first redundancy signal generating unit 530.

The first fuse signal generating unit 510 can be configured to receive the initializing signal (SET) and generate a fuse power signal (FUSE_PWR) and a laser fuse activating signal (LEN). The first fuse signal generating unit 510 can be configured to provide information indicating whether a defective memory cell exists. Therefore, when a laser fuse activating signal (LEN) is provided in response to the initializing signal (SET), information indicating that a defective memory cell exists is provided. That is, it is possible to know whether the information of a defective memory cell is stored according to whether the first fuse signal generating unit 510 cuts a fuse.

The first address signal comparing unit 520 can be configured to receive the initializing signal (SET), the fuse power signal (FUSE_PWR), the laser fuse activating signal (LEN), and the address signals (ADD<2:n>), and output comparison signals (HITM<2:n>). The first address signal comparing unit 520 can be configured to output the comparison signals (HITM<2:n>), which are activated at a high level when an address signal of the defective memory cell is received.

The first redundancy signal generating unit 530 can be configured to receive the comparison signals (HITM<2:n>) and the laser fuse activating signal (LEN), and output a first redundancy signal (HITB<0>). The first redundancy signal generating unit 530 can be configured to output the first redundancy signal (HITB<0>) that is activated at a low level, when a plurality of comparison signals (HITM<2:n>) are all activated at a high level. For the convenience of explanation, one first redundancy signal (HITB<0>) is provided in this embodiment. According to a redundancy scheme, another first redundancy signal can be used (e.g. first redundancy signal (HITB<1>)).

Figure 3A:
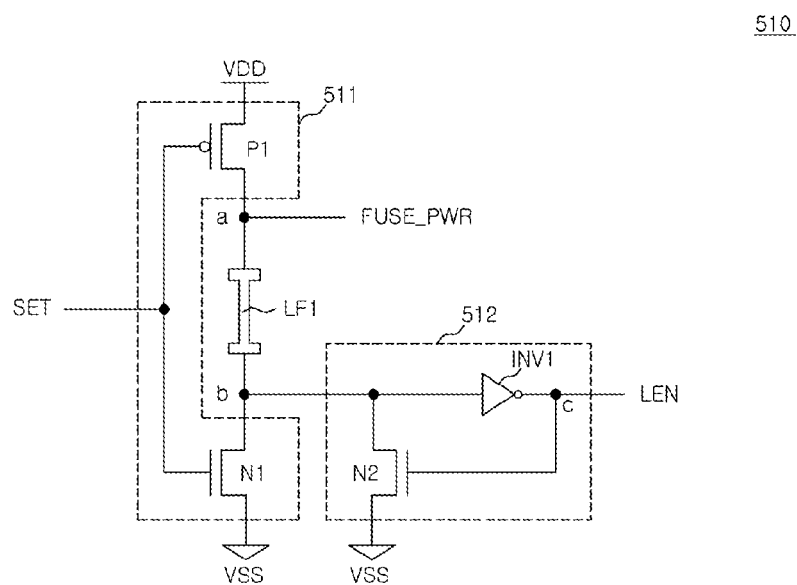
FIG. 3A is a circuit diagram illustrating a first fuse signal generating unit that can be included in the circuit illustrated in FIG. 2.

FIG. 3A is a circuit diagram illustrating a first fuse signal generating unit 510 that can be included in the circuit illustrated in FIG. 2. Referring to FIG. 3A, the first fuse signal generating unit 510 can include an initializing signal receiver 511 and a latch 512.

The initializing signal receiver 511 can include a first PMOS transistor P1 and a first NMOS transistor N1 that can be configured to receive the initializing signal (SET). The first PMOS transistor P1 can include a gate that receives the initializing signal (SET), a source connected to an external power supply VDD, and a drain connected to a node a. The first NMOS transistor N1 can include a gate that receives the initializing signal (SET), a source connected to the ground VSS, and a drain connected to a node b.

A first laser fuse LF1 can be located between the node a and the node b. The first laser fuse LF1 can be cut by a laser beam according to whether a defective memory cell exists. In this way, the initializing signal receiver 511 can output the fuse power signal (FUSE_PWR) to the node a in response to the initializing signal (SET). In addition, the initializing signal receiver 511 can output, to the node b, a signal that responds to the initializing signal (SET) according to whether the first laser fuse LF1 is cut. The initializing signal (SET) can be activated when power is up, and then deactivated after a predetermined time has elapsed. That is, the initializing signal (SET) is maintained at a high level when power is up and transits to a low level after a predetermined time has elapsed.

The latch 512 can include a first inverter INV1 and a second NMOS transistor N2. The first inverter INV1 can be configured to invert the received signal from the node b and output the inverted signal to a node c. The second NMOS transistor N2 can include a gate that can receive the signal at the node c, a source connected to the ground VSS, and a drain connected to the node b. That is, the first inverter INV1 and the second NMOS transistor N2 can be connected to each other in a latch structure, which makes it possible to invert and latch the signal at the node b.

Next, the operation of the first fuse signal generating unit 510 will be described with reference to FIG. 3A. The initializing signal receiver 511 can be configured to receive the initializing signal (SET) that is deactivated at a high level for a predetermined time when power is up, and the first NMOS transistor N1 is turned on. Therefore, the potential of the node b can transit to a low level, and the laser fuse activating signal (LEN) can become an inverted high-level signal. Then, the first PMOS transistor P1 can be turned off, and the node a is in a floating state.

After a predetermined time has elapsed, the initializing signal receiver 511 can be configured to receive the initializing signal (SET) that is activated at a low level, and the first PMOS transistor P1 is turned on. Therefore, the initializing signal receiver 511 can output the fuse power signal (FUSE_PWR) that is activated at a high level. At that time, the first NMOS transistor N1 can be turned off. Therefore, the level of the laser fuse activating signal (LEN) can be determined according to whether the first laser fuse LF1 is cut.

For example, in a case in which the first laser fuse LF1 is cut due to a defective memory cell, since the first PMOS transistor P1 is turned on and the first laser fuse LF1 is cut, a high-level signal cannot be transmitted to the node b. Therefore, the laser fuse activating signal (LEN) can be provided as a high-level signal that is latched by the latch 512. That is, when a defective memory cell exists, the first fuse signal generating unit 510 can be configured to output the laser fuse activating signal (LEN) that is activated at a high level.

Next, a case in which the first laser fuse LF1 is not cut since there is no defective memory cell will be described. Specifically, since the first PMOS transistor P1 is turned on and the first laser fuse LF1 is not cut, a high-level signal can be transmitted to the node b. Therefore, the laser fuse activating signal (LEN) becomes an inverted low-level signal. In this way, the first fuse signal generating unit 510 can control the activation of the laser fuse activating signal (LEN) according to whether the first laser fuse LF1 is cut, in response to the initializing signal (SET).

Figure 3B:
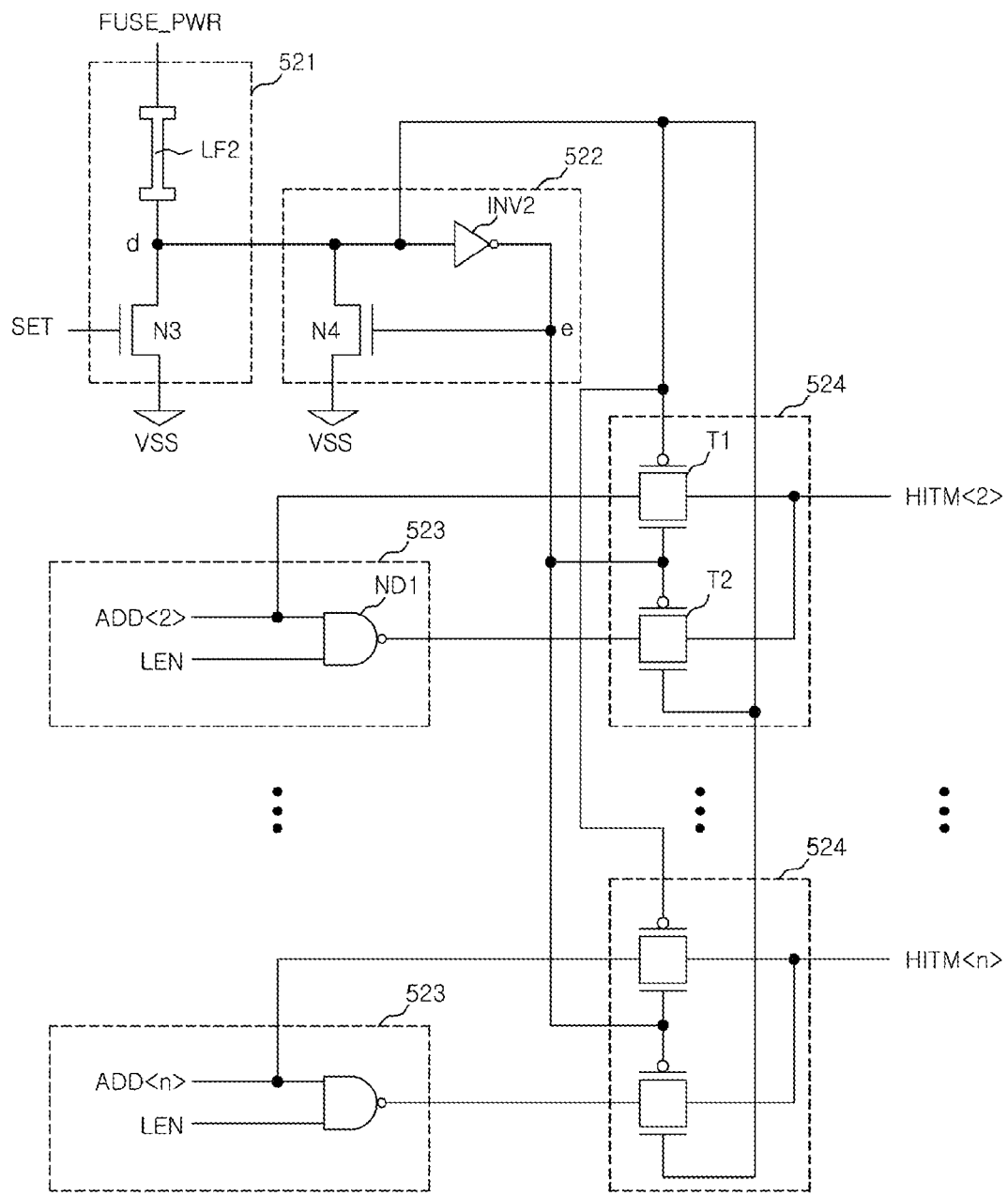
FIG. 3B is a circuit diagram illustrating a first address signal comparing unit that can be included in the circuit illustrated in FIG. 2.

FIG. 3B is a circuit diagram illustrating a first address signal comparing unit 520 that can be included in the circuit illustrated in FIG. 2. Referring to FIG. 3B, the first address signal comparing unit 520 can include a fuse signal receiver 521, a latch 522, an address signal receiver 523, and a transmitter 524.

The fuse signal receiver 521 can include a third NMOS transistor N3 that can be configured to receive the initializing signal (SET) and a second laser fuse LF2. The third NMOS transistor N3 has a gate that can be configured to receive the initializing signal (SET), a source connected to the ground VSS, and a drain connected to a node d. The second laser fuse LF2 has one end that can be connected to the node d and the other end can be connected to the fuse power signal (FUSE_PWR). The second laser fuse LF2 can be cut by a laser beam in response to a high-level signal among the address signals of targets to be repaired. The second laser fuse LF2 can be cut only in the wafer state.

The latch 522 can include a fourth NMOS transistor N4 and a second inverter INV2. Since the structure of the latch 522 is the same as that of the latch 512 of the first fuse signal generating unit 510, the structure of the latch 522 will be briefly described below. In the latch 522, the fourth NMOS transistor N4 and the second inverter INV2 are connected to each other in a latch structure. Therefore, the latch 522 can be configured to invert and latch the signal at the node d and output the latched signal to a node e.

A plurality of address signal receivers 523 can be provided to correspond to the number of address bits of comparison targets. Each of the address signal receivers 523 can include a first NAND gate ND1. The first NAND gate ND1 can be configured to receives the address signal (ADD<2:n>) and the laser fuse activating signal (LEN), can perform a NAND operation on the received signals, and output the result to a second transmission gate T2. Meanwhile, the address signal (ADD<2:n>) can be provided as the comparison signal (HITM<2:n>) through a first transmission gate T1.

A plurality of transmitters 524 may be provided to correspond to the number of address signal receivers 523. Each of the transmitters 524 can include first and second transmission gates T1 and T2. The first and second transmission gates T1 and T2 of the transmitter 524 can be selectively activated by the signals at the node d and the node e.

Next, the operation of the first address signal comparing unit 520 will be described. When the fuse signal receiver 521 receives a high-level initializing signal (SET) after power is turned on, the third NMOS transistor N3 can be configured to turn on. Then, the potential of the node d turns to a low level, and the potential of the node e turns to a high level. For a predetermined time after power is up, the first address signal comparing unit 520 is just initialized, and an effective operation for comparing addresses is not performed.

A case in which, after a predetermined time has elapsed, the initializing signal (SET) turns to a low level, and the laser fuse activating signal (LEN) is activated at a high level will be described. In this case, since the third NMOS transistor N3 is turned off, the potential level of the node d can be determined according to whether the second laser fuse LF2 is cut. It is assumed that a defective memory cell exists, and the second laser fuse LF2 is cut in response to a high-level signal among the address signals. In this case, the potential of the node d latched by the latch 522 is a low level, and the potential of the node e is a high level. As a result, the first transmission gate T1 can be turned on, and the second transmission gate T2 can be turned off. Therefore, the address signal (ADD<2:n>) passing through the first transmission gate T1 in an on state can be provided as the comparison signal (HITM<2:n>).

However, when the address of a defective memory cell is a low-level signal, the second laser fuse LF2 is not cut. Therefore, a high-level fuse power signal (FUSE_PWR) can be provided to the node d, and a low-level signal is provided to the node e. As a result, the second transmission gate T2 can be turned on, and the first transmission gate T1 can be turned off. Meanwhile, when receiving the address signal (ADD<2:n>) and the activated high-level laser fuse activating signal (LEN), the first NAND gate ND1 can output an inverted signal of the address signal (ADD<2:n>). Therefore, the first address signal comparing unit 520 can output the inverted signal of the address signal (ADD<2:n>) as the comparison signal (HITM<2:n>) through the second transmission gate T2.

In other words, in the first address signal comparing unit 520, the second laser fuse LF2 can be cut in response to a high-level signal among the address signals of defective memory cells. That is, the activated high-level laser fuse activating signal (LEN) can be configured to serve as information indicating that a defective memory cell exists. Therefore, when a defective memory cell exists, the first address signal comparing unit 520 can output high-level comparison signals (HITM<2:n>) in response to the activated laser fuse activating signal (LEN) and the second laser fuse LF2. For example, when the second laser fuse LF2 is cut, input address signals (ADD<2:n>) can be output as their logic level, that is, a high-level signal is output as the comparison signals (HITM<2:n>). However, when the second laser fuse LF2 is not cut, input address signals (ADD<2:n>) at a low level can be inverted by an inverting path, and the inverted address signal can be output as the comparison signals (HITM<2:n>).

Figure 3C:
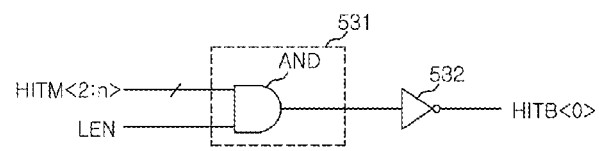
FIG. 3C is a circuit diagram illustrating a first redundancy signal generating unit that can be included in the circuit illustrated in FIG. 2.

FIG. 3C is a circuit diagram illustrating a first redundancy signal generating unit 530 that can be included in the circuit illustrated in FIG. 2. Referring to FIG. 3C, the first redundancy signal generating unit 530 can be configured to generate a redundancy signal (HITB<0>) in response to the comparison signals (HITM<2:n>) and the fuse activating signal (LEN). The first redundancy signal generating unit 530 can include a coincidence circuit 531 and an inverter 532. For the convenience of explanation, the coincidence circuit 531 can be composed of an AND gate having a plurality of input terminals. The inverter 532 can be composed of an inverting element in this embodiment, but is not limited thereto.

When receiving an activated high-level laser fuse activating signal (LEN) and high-level comparison signals (HITM<2:n>), the first redundancy signal generating unit 530 can be configured to output an inverted low-level first redundancy signal (HITB<0>). That is, only when all of the input address signals (ADD<2:n>) are matched with the addresses of defective memory cells, the first redundancy signal generating unit 530 can output an activated low-level first redundancy signal (HITB<0>). As described above, it goes without saying that the first redundancy signal (HITB<1>) can be provided. The first redundancy signal (HITB<0>) is capable of controlling the redundancy word lines RWL of the first and second memory cell arrays 11 and 12 (see FIG. 1) to be fused by a laser beam in order to repair the defective memory cells.

Figure 4:
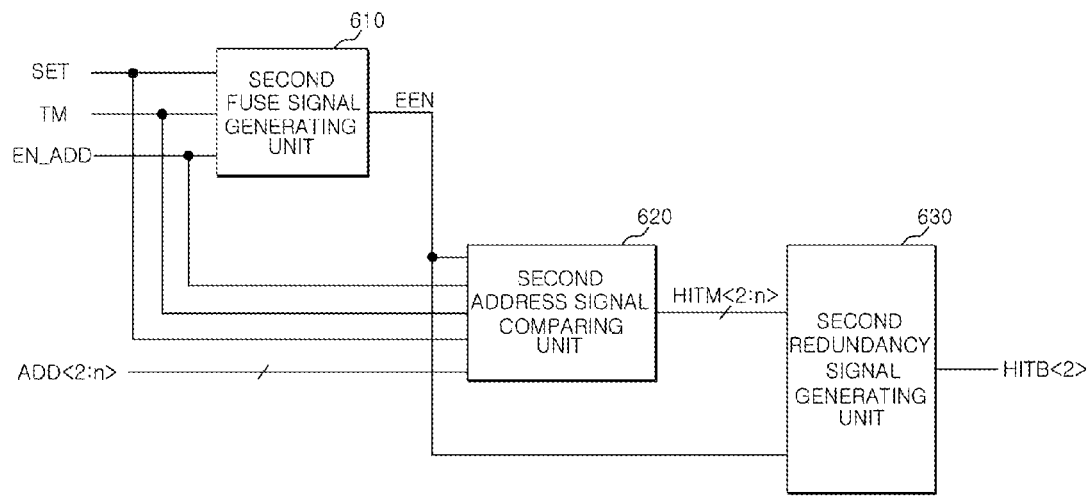
FIG. 4 is a block diagram illustrating an electrical fuse set that can be included in the circuit illustrated in FIG. 1.

Next, an electrical fuse set 600, capable of repairing a defective memory cell in the wafer and package states, will be described. FIG. 4 is a block diagram illustrating an electrical fuse set 600 that can be included in the circuit illustrated in FIG. 1. Referring to FIG. 4, the electrical fuse set 600 can include a second fuse signal generating unit 610, a second address comparing unit 620, and a second redundancy signal generating unit 630.

The second fuse signal generating unit 610 can be configured to receive the initializing signal (SET), the test mode signal (TM), and a specific address signal (EN_ADD), and output an electrical fuse activating signal (EEN). The second fuse signal generating unit 610 can be composed of an electrical fuse such that a defective memory cell can be repaired in the package state as well as in the wafer state. The second fuse signal generating unit 610 can be programmed such that, when a defective memory cell exists, the defective memory cell can be repaired. The electrical fuse of the second fuse signal generating unit 610 can be cut by a transient current in order to repair a defective memory cell.

In one embodiment described herein, an electrical fuse can be used. Other embodiments can use any type of fuse as long as it can be cut in the wafer and package states. For example, an anti fuse can be used. When the second fuse signal generating unit 610 outputs an activated electrical fuse activating signal (EEN), information indicating that a defective memory cell is exists can be provided. That is, it is possible to know whether a defective memory cell exists according to whether the electrical fuse of the second fuse signal generating unit 610 has been cut.

The second address signal comparing unit 620 can be configured to receive the initializing signal (SET), the test mode signal (TM), the electrical fuse activating signal (EEN), a specific address signal (EN_ADD), and the address signal (ADD<2:n>), and output the comparison signals (HITM<2:n>). The second address signal comparing unit 620 can be configured to output the comparison signal (HITM<2:n>) which can be activated at a high level when the address signal (ADD<2:n>) of a defective memory cell is received.

The second redundancy signal generating unit 630 can be configured to receive the comparison signals (HITM<2:n>) and the electrical fuse activating signal (EEN), and output a second redundancy signal (HITB<2>). The second redundancy signal generating unit 630 can be configured to output the second redundancy signal (HITB<2>) that is activated at a low level, when a plurality of comparison signals (HITM<2:n>) and the electrical fuse activating signal (EEN) are all activated at a high level. According to the redundancy scheme, e.g., the second redundancy signal (HITB<3>) can also be provided.

Figure 5A:
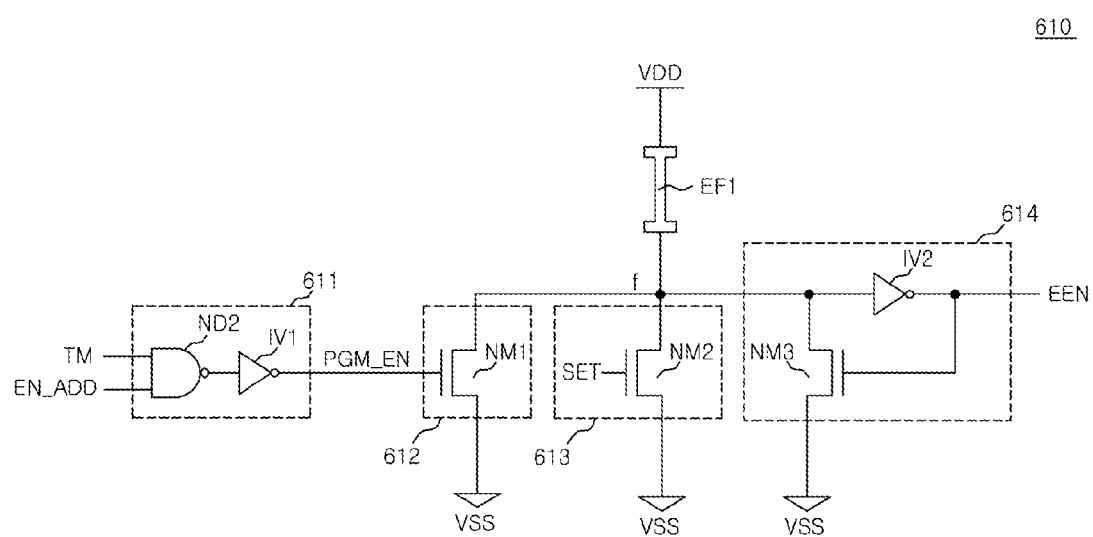
FIG. 5A is a circuit diagram illustrating a second fuse signal generating unit that can be included in the circuit illustrated in FIG. 4.

FIG. 5A is a circuit diagram illustrating a second fuse signal generating unit 610 that can be included in the circuit illustrated in FIG. 4. Referring to FIG. 5A, the second fuse signal generating unit 610 can include a fuse controller 611, a control signal receiver 612, an initializing signal receiver 613, and a latch 614.

The second fuse signal generating unit 610 can be programmed such that, when a defective memory cell exists in a wafer state or a package state, it can output information indicating that the defective memory cell exists.

The fuse controller 611 can include a second NAND gate ND2 and a first inverter IV1. The fuse controller 611 can be configured to generate a programmable control signal. That is, the fuse controller 611 can be configured to receive a test mode signal (TM) and a specific address signal (EN_ADD), and output a control signal (PGM_EN). The test mode signal (TM) is one illustrative example, and the embodiments described herein are not limited thereto. The specific address signal (EN_ADD) can be an address signal other than the address signals (ADD<2:n>), which can be received by the laser fuse set (see reference numeral 500 in FIG. 1) or the electrical fuse set (see reference numeral 600 in FIG. 1).

In one embodiment described herein, the specific address signal (EN_ADD) can be the 0th or 1st address. Other address signals can be used in other embodiments. That is, signals except the address signal of a comparison target for determining the redundancy word line RWL can be used as the address signal (EN_ADD). In this embodiment, the fuse controller 611 can output a control signal (PGM_EN) that is activated at a high level, when both the test mode signal (TM) and the specific address signal (EN_ADD) are at a high level.

The control signal receiver 612 can include an NMOS transistor NM1 that can be configured to receive the control signal (PGM_EN). The NMOS transistor NM1 has a gate that can be configured to receive the control signal (PGM_EN), a source connected to the ground VSS, and a drain connected to a node f. Particularly, the NMOS transistor NM1 can have high drivability. Therefore the NMOS transistor NM1 can be configured to flow a large amount of current, when the NMOS transistor NM1 is turned on.

A first electrical fuse EF1 can be connected between the node f and the external power supply VDD. The first electrical fuse EF1 can be programmed to store information indicating whether a defective memory cell exists. That is, the first electrical fuse EF1 can be cut when a defective memory cell exists.

The initializing signal receiver 613 can include a second NMOS transistor NM2 that can be configured to receive the initializing signal (SET). The second NMOS transistor NM2 can have a gate that can be configured to receive the initializing signal (SET), a source connected to the ground VSS, and a drain connected to the node f. Since the initializing signal (SET) has already been described in the laser fuse set (see reference numeral 500 in FIG. 1), a detailed description thereof will be omitted.

The latch 614 can include a third NMOS transistor NM3 and a second inverter IV2 that can be connected to each other in a latch structure. The latch 614 can be configured to receive the signal from the node f, and output the electrical fuse activating signal (EEN).

Next, the operation of the second fuse signal generating unit 610 will be described below with reference to FIG. 5A. When the second fuse signal generating unit 610 receives an activated initializing signal (SET), the potential of the node f can be at a low level. Then, when the second NMOS transistor NM2 receives a deactivated low-level initializing signal (SET) and is then turned off, the potential of the node f can vary according to whether the first electrical fuse EF1 is cut.

If a defective memory cell exists in the wafer and package states, the first electrical fuse EF1 of the second fuse signal generating unit 610 should be programmed. If a defective memory cell exists in the wafer and package states, the fuse controller 611 can be configured to receive a high-level test mode signal (TM) and a high-level specific address signal (EN_ADD), and output a control signal (PGM_EN) that can be activated at a high level. Then, the first NMOS transistor NM1 can be turned on. At that time, the external power supply voltage VDD can be applied to one end of the first electrical fuse EF1. As described above, since the first NMOS transistor NM1 has high drivability, a considerably large amount of current can flow from the external power supply VDD to the ground VSS through the first electrical fuse EF1. That is, the first electrical fuse EF1 is cut by a transient current. Then, the potential of the node f becomes a low level, and a high-level electrical fuse activating signal (EEN) is provided.

If there is no defective memory cell in the wafer and package states, the first electrical fuse EF1 is not cut in the second fuse signal generating unit 610. Therefore, the fuse controller 611 receives the test mode signal (TM) that is deactivated at a low level and the specific address signal (EN_ADD) that is deactivated at a low level, and outputs a control signal (PGM_EN) that is deactivated at a low level. Then, the first NMOS transistor NM1 can turn off, and thus the first electrical fuse EF1 is not cut, as described above. As a result, a high-level external power supply voltage VDD is applied to the node f, which makes it possible to provide the electrical fuse activating signal (EEN) that is inactive at a low level.

Figure 5B:
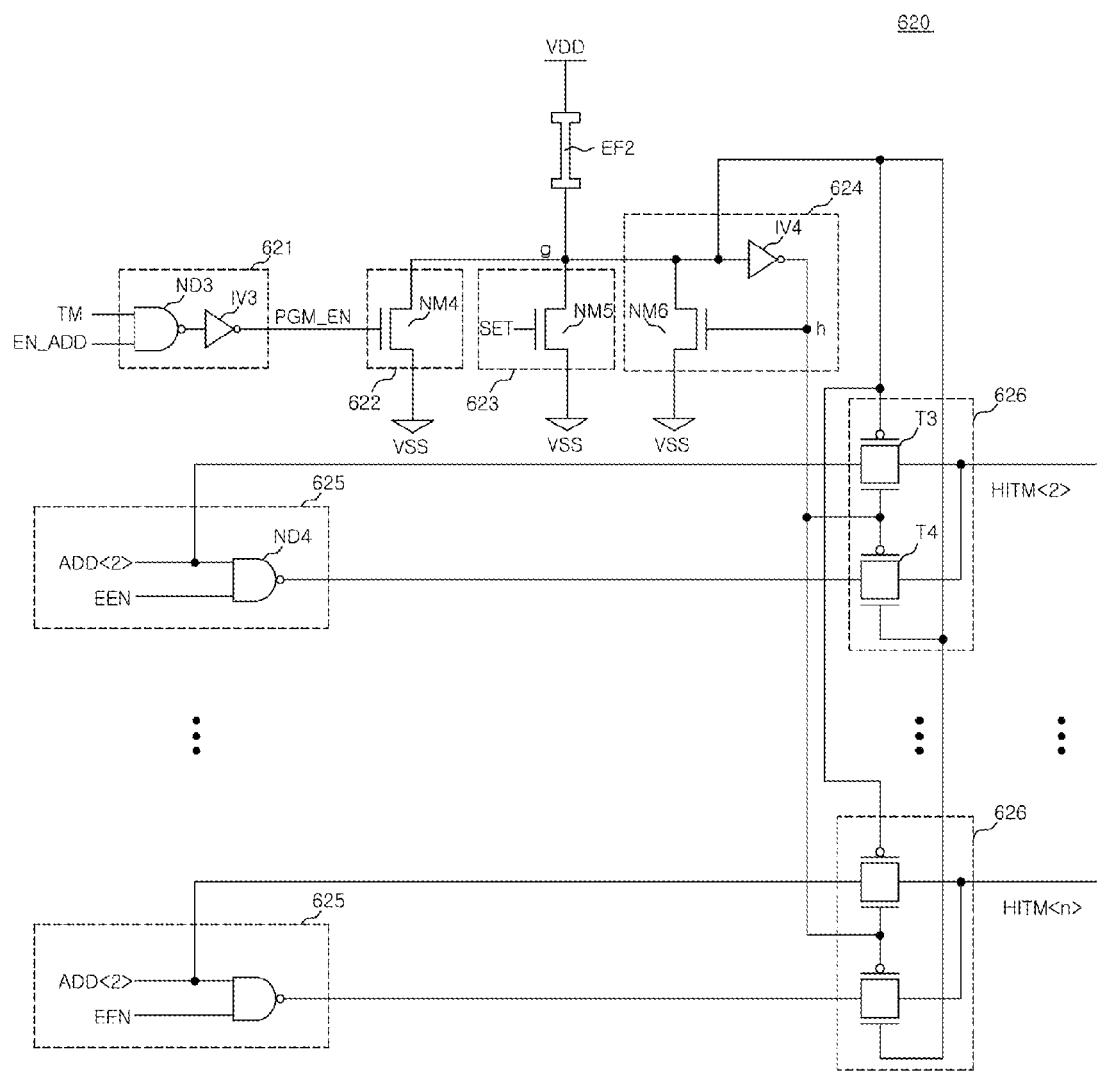
FIG. 5B is a circuit diagram illustrating a second address signal comparing unit that can be included in the circuit illustrated in FIG. 4.

FIG. 5B is a circuit diagram illustrating a second address signal comparing unit 620 that can be included in the circuit illustrated in FIG. 4. Referring to FIG. 5B, the second address signal comparing unit 620 can include a fuse controller 621, a control signal receiver 622, an initializing signal receiver 623, a latch 624, an address signal receiver 625, and a transmitter 626.

The fuse controller 621, the control signal receiver 622, the initializing signal receiver 623, and the latch 624 can be configured to have the same structures as the fuse controller 611, the control signal receiver 612, the initializing signal receiver 613, and the latch 614 shown in FIG. 5A, and thus a description thereof will be omitted.

A plurality of address signal receivers 625 can be provided to correspond to the number of address bits of comparison targets. Each of the address signal receivers 625 can include a fourth NAND gate ND4. The fourth NAND gate ND4 can be configured to receives the address signal (ADD<2:n>) and the electrical fuse activating signal (EEN), perform a NAND operation on the received signals, and output the result to the fourth transmission gate T4. The address signals (ADD<2:n>) may be transmitted as the comparison signals (HITM<2:n>) through the third transmission gate T3.

A plurality of transmitters 626 can be provided to correspond to the number of address signal receivers 625. Each of the transmitters 626 can include third and fourth transmission gates T3 and T4. The third and fourth transmission gates T3 and T4 of the transmitter 626 may be selectively activated by the signals at the nodes g and h.

Next, the operation of the second address signal comparing unit 620 will be described with reference to FIG. 5B. In the initial state of the second address signal comparing unit 620, when the initializing signal (SET) that is activated at a high level is received, a fifth NMOS transistor NM5 can be turned on, and the potential of the node g becomes a low level. Thereafter, when the initializing signal (SET) turns to a low level, the potential level of the node g can be determined according to the operation of the fuse controller 621.

When a defective memory cell exists in the wafer and package states, the second electrical fuse EF2 of the second address signal comparing unit 620 should be programmed. The second electrical fuse EF2 can be cut by a high-level signal among the address signals of the defective memory cells. The fuse controller 621 can be configured to receive an activated test mode signal (TM) and an activated specific address signal (EN_ADD), and output a control signal (PG-M_EN) that is activated at a high level. Then, the fourth NMOS transistor NM4 can be turned on. At that time, the external power supply voltage VDD can be applied to one end of the second electrical fuse EF2. The fourth NMOS transistor NM4 has high drivability. Therefore, when the fourth NMOS transistor NM4 is turned on, a considerably large amount of current can flow from the external power supply VDD to the ground VSS through the second electrical fuse EF2. That is, the second electrical fuse EF2 is cut by a transient current, and the potential of the node g becomes a low level. In this way, the third transmission gate T3 is turned on, and the address signals (ADD<2:n>) can be provided as the comparison signals (HITM<2:n>). Since the second electrical fuse EF2 is cut by a high-level signal among the address signals of the defective memory cells, a high-level address signals (ADD<2:n>) can be provided as the comparison signals (HITM<2:n>).

If the address of the defective memory cell has a low level, the second electrical fuse EF2 is not cut in the second address signal comparing unit 620. Therefore, the fuse controller 621 can be configured to receive a test mode signal (TM) that is inactivated at a low level and a specific address signal (EN_ADD) that is inactivate at a low level, and output a control signal (PGM_EN) that is inactivate at a low level. Then, the fourth NMOS transistor NM4 can turn off, and the second electrical fuse EF2 is not cut, as described above. As a result, a high-level external power supply voltage VDD is applied to the node g, and a low-level signal is provided to the node h. In this case, an inverted signal of the address signals (ADD<2:n>) output from the address signal receiver 625 can be provided as the comparison signals (HITM<2:n>) through the fourth transmission gate T4. That is, since an input address signals (ADD<2:n>) can be a low-level signal among the address signals of defective memory cells, the second electrical fuse EF2 is not cut. Therefore, it is possible to invert the low-level address signals (ADD<2:n>) and provide the comparison signals (HITM<2:n>) that is activated at a high level.

Figure 5C:
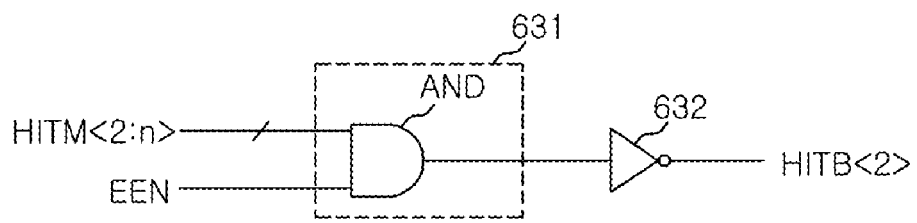
FIG. 5C is a circuit diagram illustrating a second redundancy signal generating unit that can be included in the circuit illustrated in FIG. 4.

FIG. 5C is a circuit diagram illustrating a second redundancy signal generating unit 630 that can be configured to output the redundancy signal (HITB<2>) in response to the comparison signals (HITM<2:n>) output from the electrical fuse set (see 600 in FIG. 1). The second redundancy signal generating unit 630 can include a coincidence circuit 631 and an inverter 632. An AND gate is one example that can be used as the coincidence circuit 631. The inverter 632 can be connected to the coincidence circuit 631, and can be configured to invert a signal output from the coincidence circuit 631 to generate a second redundancy signal (HITB<2>).

The second redundancy signal generating unit 630 can have the same structure and function as the first redundancy signal generating unit (see reference numeral 530 in FIG. 3C), and thus a detailed description thereof will be omitted. The second redundancy signal generating unit 630 can differ from the first redundancy signal generating unit (see reference numeral 530 in FIG. 3C) in that it can be configured to receive an electrical fuse activating signal (EEN). That is, the second redundancy signal generating unit 630 can be controlled by the electrical fuse activating signal (EEN) generated by the electrical fuse set (see reference numeral 600 in FIG. 1). When both the comparison signals (HITM<2:n>) and the electrical fuse activating signal (EEN) are activated at a high level, it is possible to provide the inverted second redundancy signal (HITB<2>) that is activated at a low level.

For the convenience of explanation, the second redundancy signal (HITB<2>) is described, but the second redundancy signal (HITB<3>) may be provided in the same manner as described above. Particularly, in this embodiment, the second redundancy signal (HITB<2>) or (HITB<3>) can control the memory cell arrays (see reference numerals 13 and 14 in FIG. 1). Thus, the second redundancy signal (HITB<2>) or (HITB<3>) can control memory cell arrays other than the memory cell arrays (see reference numerals 11 and 12 in FIG. 1) which are controlled by the first redundancy signal (HITB<0>) or (HITB<1>).

Figure 6:
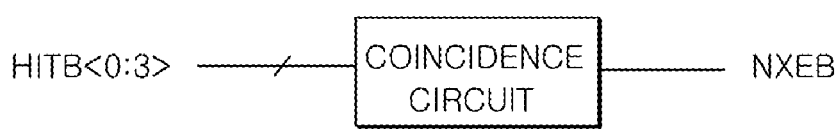
FIG. 6 is a block diagram schematically illustrating a normal word line control unit that can be included in the circuit illustrated in FIG. 1.

FIG. 6 is a diagram illustrating the structure of the normal word line control unit 40. Referring to FIG. 6, the normal word line control unit 40 can be configured to receive the first and second redundancy signals (HITB<0:3>) and output a normal word line control signal (NXEB).

Specifically, when at least one of the first and second redundancy signals (HITB<0:3>) is activated at a low level and the normal word line control unit 40 receives the signals, the coincidence circuit 41 can be configured to output the normal word line control signal (NXEB) that is deactivated at a high level. That is, the normal word line WL is not driven by the normal word line driver (see reference numeral 20 in FIG. 1). Then the redundancy word line RWL, controlled by at least one of the first and second redundancy signals (HITB<0:3>) that is activated at a low level, can be driven driven.

However, when the coincidence circuit 41 receives first and second redundancy signals (HITB<0:3>), which are all deactivated at a high level, the normal word line control unit 40 can output the normal word line control signal (NXEB) that is activated at a low level. Therefore, the normal word line WL can be driven, but the redundancy word line RWL is not driven. This method of controlling the redundancy word line will be understood by those skilled in the art.

As described above, in this embodiment, the electrical fuse set (see reference numeral 600 in FIG. 1) can control other memory cell arrays (see reference numerals 13 and 14 in FIG. 1) which are not overlapped with the memory cell arrays (see reference numerals 11 and 12 in FIG. 1) which are not controlled by the laser fuse set (see reference numeral 500 in FIG. 1). As a result, it is possible to repair defective memory cells in the wafer and package states in the third and fourth memory cell arrays (see reference numerals 13 and 14 in FIG. 1).

Although not limited hereto, for the convenience of explanation, in this embodiment, the number of memory cell arrays (see reference numerals 11 and 12 in FIG. 1) controlled by the laser fuse set (see reference numeral 500 in FIG. 1) is equal to the number of memory cell arrays (see reference numerals 13 and 14 in FIG. 1) controlled by the electrical fuse set (see reference numeral 600 in FIG. 1). The word line of a defective memory cell occurring in the wafer state may be replaced with the redundancy word line RWL of one of the memory cell arrays (see reference numerals 11 to 14 in FIG. 1) by using both the laser and electrical fusing methods. In addition, the word line of a defective memory cell occurring in the package state may be replaced with the redundancy word line RWL of one of the third and fourth memory cell arrays (see reference numerals 13 and 14 in FIG. 1) controlled by the electrical fuse set (see reference numeral 600 in FIG. 1).

In other words, when a defective memory cell occurs in the wafer state, first, the laser fuse set (see reference numeral 500 in FIG. 1) can be used to drive the redundancy word lines RWL of the first and second memory cell arrays (see reference numerals 11 and 12 in FIG. 1), which is a simple and accurate method. If a plurality of defective memory cells occur and it is difficult to control the redundancy word lines RWL by using only the laser fuse set (see reference numeral 500 in FIG. 1), the electrical fuse set (see reference numeral 600 in FIG. 1) can be used to drive the redundancy word lines of the third and fourth memory cell arrays 13 and 14. When a defective memory cell occurs in the package state, the redundancy word line RWL can be driven by the electrical fuse set (see reference numeral 600 in FIG. 1) that remains in the wafer without being used. In this way, it is possible to repair a defective memory cell occurring in the package state.

According to the above-described embodiment, it is possible to repair a defective memory cell occurring in the package state as well as in the wafer state. It is possible to replace a defective memory cell occurring in the wafer state and the package state with a redundancy memory cell by using both the laser fuse set and the electrical fuse set. Specifically, the above-described embodiments include both the memory cell array controlled by the laser fuse set and the memory cell array controlled by the electrical fuse set. According to this structure, it is possible to repair a defective memory cell occurring in the wafer state by using the laser fuse set and the electrical fuse set, and a defective memory cell occurring in the package state by using the electrical fuse set. As a result, redundancy efficiency can be improved.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A redundancy circuit, comprising:
   a first fuse set that is configured to receive an address signal and an initializing signal activated when power is up, and to output a first redundancy signal, the first redundancy signal being used to repair a first defective memory cell by using a laser beam radiating method;
   a second fuse set that is configured to receive the initializing signal, a specific address signal, a test mode signal that is activated when a second defective memory cell is existent, and the address signal, and to output a second redundancy signal, the second redundancy signal being used to repair the second defective memory cell by using an electrical fusing method;
   a first memory cell array that is controlled by the first redundancy signal; and
   a second memory cell array that is controlled by the second redundancy signal.

2. The redundancy circuit of claim 1, wherein the first fuse set comprises:
   a first fuse signal generating unit that is configured to receive the initializing signal and to generate a fuse power signal and a first fuse signal;
   a first address signal comparing unit that is configured to receive the initializing signal, the fuse power signal, the first fuse signal, and the address signal, and to output a first comparison signal; and
   a first redundancy signal generating unit that is configured to receive an activated first comparison signal and an activated first fuse signal, and to output an activated first redundancy signal.

3. The redundancy circuit of claim 2, wherein the first fuse signal generating unit comprises a first fuse, and when receiving an inactivated initializing signal, the first fuse signal generating unit is configured to output the first fuse signal according to whether the first fuse is cut.

4. The redundancy circuit of claim 3, wherein, when the first defective memory cell is existent, the first fuse is cut by a laser beam.

5. The redundancy circuit of claim 2, wherein the first address signal comparing unit comprises a second fuse, and when receiving an inactivated initializing signal, the first address signal comparing unit is configured to output the first comparison signal according to whether the second fuse is cut.

6. The redundancy circuit of claim 5, wherein, when the second fuse is cut, the first address signal comparing unit is configured to output the received address signal as the first comparison signal, and when the second fuse is not cut, the first address signal comparing unit is configured to invert the received address signal and to output the inverted signal as the first comparison signal.

7. The redundancy circuit of claim 5, wherein the second fuse is cut by the laser beam in response to a high-level signal among the address signals of defective memory cells.

8. The redundancy circuit of claim 1, wherein the second fuse set comprises:
   a second fuse signal generating unit that is configured to receive the initializing signal, the test mode signal, and the specific address signal, and to output a second fuse signal;
   a second address signal comparing unit that is configured to receive the initializing signal, the test mode signal, the specific address signal, and the address signal, and to output a second comparison signal; and
   a second redundancy signal generating unit that is configured to receive an activated second comparison signal and an activated second fuse signal, and to output an activated second redundancy signal.

9. The redundancy circuit of claim 8, wherein the second fuse signal generating unit comprises a third fuse, and when receiving the inactivated initializing signal, the second fuse signal generating unit is configured to output the second fuse signal according to whether the third fuse is cut.

10. The redundancy circuit of claim 8, wherein the specific address signal is a signal except the address signals of comparison targets for redundancy, and when the second defective cell is existent, the specific address signal is activated.

11. The redundancy circuit of claim 8, wherein the second address signal comparing unit comprises a fourth fuse, and when receiving the inactivated initializing signal, the second address signal comparing unit is configured to output the logical level of the received address signal and/or an inverted logical level thereof as the second comparison signal, according to whether the fourth fuse is cut.

12. A redundancy circuits comprising:
   a first fuse set circuit that includes a plurality of first fuse sets which is configured to receive an address signal and an initializing signal activated when power is up and to output a plurality of first redundancy signals;
   a second fuse set circuit that includes a plurality of second fuse sets which is configured to receive the initializing signal, a specific address signal, a test mode signal that is activated when a second defective memory cell is existent, and the address signal and to output a plurality of second redundancy signals;
   a first memory cell array that is controlled by the first redundancy signals; and
   a second memory cell array that is controlled by the second redundancy signals, wherein the first fuse set is configured to output the first redundancy signal for driving a redundancy word line of the first memory cell array in response to a first defective memory cell occurring in a wafer state, and wherein the second fuse set is configured to output the second redundancy signal for driving a redundancy word line of the second memory cell array in response to the second defective memory cell occurring in the wafer state and a package state.

13. The redundancy circuit of claim 12, wherein the first fuse set comprises:

a first fuse signal generating unit that is configured to receive the initializing signal and to output a fuse power signal and a first fuse signal;

a first address signal comparing unit that is configured to receive the initializing signal, the fuse power signal, the first fuse signal, and the address signal and to output a first comparison signal; and a first redundancy signal generating unit that is configured to receive an activated first comparison signal and an activated first fuse signal and to output an activated first redundancy signal.

14. The redundancy circuit of claim 13, wherein the first fuse signal generating unit comprises a first fuse, and when receiving an inactivated initializing signal, the first fuse signal generating unit is configured to output the first fuse signal according to whether the first fuse is cut.

15. The redundancy circuit of claim 14, wherein, when the first defective memory cell is existent, the first fuse is cut by a laser beam.

16. The redundancy circuit of claim 13, wherein the first address signal comparing unit comprises a second fuse, and when receiving the inactivated initializing signal, the first address signal comparing unit is configured to output the first comparison signal according to whether the second fuse is cut.

17. The redundancy circuit of claim 16, wherein, when the second fuse is cut, the first address signal comparing unit is configured to output the received address signal as the first comparison signal, and when the second fuse is not cut, the first address signal comparing unit is configured to invert the received address signal and to output the inverted signal as the first comparison signal.

18. The redundancy circuit of claim 16, wherein the second fuse is cut by the laser beam in response to a high-level signal among the address signals of defective memory cells.

19. The redundancy circuit of claim 12, wherein the second fuse set comprises:

a second fuse signal generating unit that is configured to receive the initializing signal, the test mode signal, and the specific address signal, and to output a second fuse signal;

a second address signal comparing unit that is configured to receive the initializing signal, the test mode signal, the specific address signal, and the address signal, and to output a second comparison signal; and a second redundancy signal generating unit that is configured to receive an activated second comparison signal and an activated second fuse signal, and to output an activated second redundancy signal.

20. The redundancy circuit of claim 19, wherein the second fuse signal generating unit comprises a third fuse, and when receiving the inactivated initializing signal, the second fuse signal generating unit is configured to output the second fuse signal according to whether the third fuse is cut.

21. The redundancy circuit of claim 19, wherein the specific address signal is a signal except the address signals of comparison targets for redundancy, and when the second defective cell is existent, the specific address signal is activated.

22. The redundancy circuit of claim 19, wherein the second address signal comparing unit comprises a fourth fuse, and when receiving the inactivated initializing signal, the second address signal comparing unit is configured to output the logical level of the received address signal and/or an inverted logical level thereof as the second comparison signal, according to whether the fourth fuse is cut.

23. The redundancy circuit of claim 21, when the third fuse is cut by a transient current when the second defective memory cell is existent, and the fourth fuse is cut by a transient current in response to a high-level signal among the address signals of defective memory cells.

24. A redundancy circuit having a fuse set configured to produce a signal to repair a defective memory cell by using a laser beam radiating method, the fuse set, comprising:

a fuse signal generating unit configured to receive an initializing signal and to generate a fuse power signal and a fuse signal;

an address signal comparing unit configured to receive the initializing signal, the fuse power signal, the fuse signal, and an address signal, and to output a comparison signal; and a redundancy signal generating unit configured to receive an activated comparison signal and an activated fuse signal, and to output an activated redundancy signal.

25. A redundancy circuit having a fuse set producing a signal to repair a defective memory cell repair signal by using an electrical fusing method, the fuse set, comprising:

a fuse signal generating unit configured to receive an initializing signal, a test mode signal, and a specific address signal, and to output a fuse signal;

an address signal comparing unit configured to receive the initializing signal, the test mode signal, the specific address signal, and the address signal, and to output a comparison signal; and a redundancy signal generating unit configured to receive an activated comparison signal and an activated fuse signal, and to output an activated redundancy signal.

* * * * *